United States Patent [19]
Okudaira et al.

[11] Patent Number: 5,686,834
[45] Date of Patent: Nov. 11, 1997

[54] HANDLING SYSTEM

[75] Inventors: Tetsuya Okudaira; Akio Nakamura; Yoshihiro Goto, all of Tokyo, Japan

[73] Assignee: Ando Electric Co., Ltd., Tokyo, Japan

[21] Appl. No.: 717,258

[22] Filed: Sep. 20, 1996

[30] Foreign Application Priority Data

Sep. 28, 1995 [JP] Japan ................................. 7-274720

[51] Int. Cl.$^6$ ............................ G01R 31/02; G01R 31/26
[52] U.S. Cl. ........................ 324/158.1; 209/573; 324/754
[58] Field of Search ............................ 324/158.1, 754, 324/755, 758, 760, 761; 209/573; 198/394, 395; 414/416, 422, 937

[56] References Cited

U.S. PATENT DOCUMENTS 5,177,434  1/1993  Suzuki et al. ........................... 324/755
5,510,724  4/1996  Itoyama et al. ......................... 324/760

FOREIGN PATENT DOCUMENTS 8-078497  3/1996  Japan .
8-262103  10/1996  Japan .

*Primary Examiner*—Ernest F. Karlsen
*Assistant Examiner*—Anh Phung
*Attorney, Agent, or Firm*—Flynn, Thiel, Boutell & Tanis, P.C.

[57] ABSTRACT

A handling system which carries a carrier carrying a plurality of IC devices, subjects the IC devices to testing, sorts the tested IC devices and stores the tested IC devices, said handling system comprises test units for electrically connecting IC devices to an IC socket for transmitting electrical signals provided by the IC devices to an IC tester; a loader/unloader unit for transferring IC devices to be tested from a container to a carrier, sorting tested IC devices and selectively transferring the tested IC devices from the carrier to containers; and carrier transfer units combined with the test units, respectively, to transfer the carrier from the loader/unloader unit to the corresponding test units and from the corresponding test units to the loader/unloader unit. The number of the test units to be used in combination with the loader/unloader unit being varied according to test time required by the IC tester for testing the IC devices contained in the carrier.

1 Claim, 5 Drawing Sheets

TEST UNIT 2    LOADER / UNLOADER UNIT 1

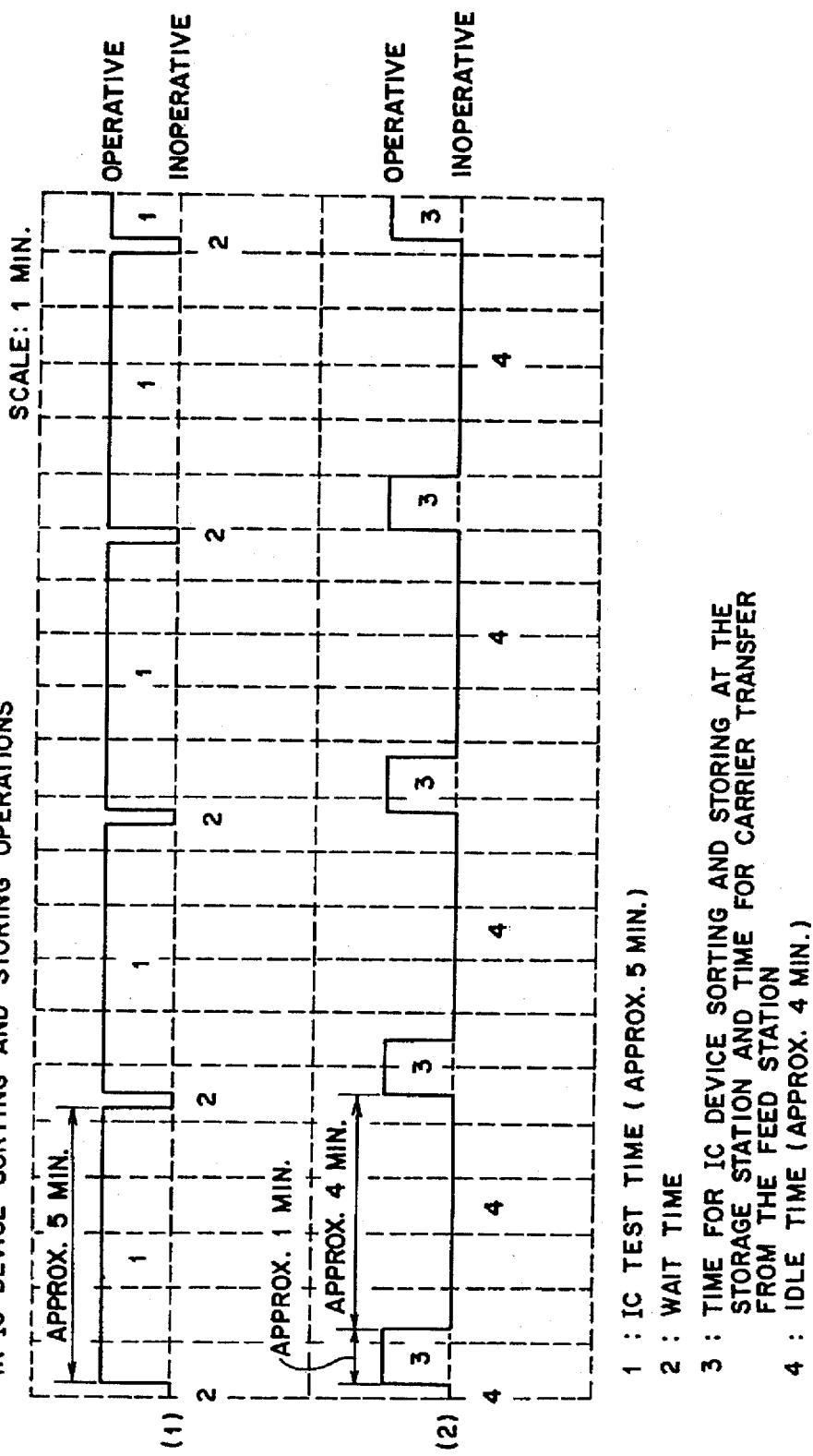

HANDLING SYSTEM

BACKGROUND OF THE INVENTION

1. Field of the Invention

The present invention relates to a handling system and, more specifically, to a handling system capable of changing its arrangement according to IC testing time required by an IC test unit in an IC testing process.

2. Description of the Related Art

A widely used known handling system comprises, in combination, a loader/unloader unit and a test unit. The loader/unloader unit feeds a carrier carrying a plurality of IC devices to the test unit to test the IC devices on the test unit, recovers tested IC devices, sorts the tested IC devices and selectively stores the IC devices in storage containers. FIG. 4 shows a conventional handling system, i.e., an autohandler, comprising a loader/unloader unit 61 and a test unit 67, which are installed on a single frame. The loader/unloader unit 61 carries ICs devices 63 from a container 64, such as a magazine or a tray, to a carrier 66 placed in a feed station 65 by a suction feed hand 62. The carrier 66 is transferred through a preheating station 68 in the test unit 67 to a measuring unit 69. Then, the IC devices 63 are connected electrically to an IC socket 70 for test measurement. After the test measurement of the IC devices 63 has been completed, the carrier 66 is transferred to a storage station 71 in the loader/unloader unit 61. Then, a return suction hand 72 sorts the IC devices 63, and carries the IC devices 63 selectively to the containers 64. The carrier 66 is capable of holding a plurality of IC devices 63 to enable the simultaneous measurement of the plurality of IC devices 63.

Referring to FIG. 5 showing a timing chart expressing the operations of the known handling system. Operations for sorting and selectively transferring the IC devices 63 from the carrier 66 to the containers 64 at the storage station 71 of the loader/unloader unit 61 and for transferring the IC devices 63 from the container 64 to the carrier 66 ((3)) need about one minute. The loader/unloader unit 61 stays inoperative for an idle time of about four minutes ((4)) when the test time required by the IC tester for testing the IC devices 63 is as long as five minutes.

SUMMARY OF THE INVENTION

It is an object of the present invention to provide a handling system capable of reducing the idle time of a loader/unloader unit for efficient operation, requiring a small investment in constructing the same and capable of being readily rearranged for measuring IC devices requiring a short test time.

According to the present invention, a handling system which carries a carrier carrying a plurality of IC devices, subjects the IC devices to testing, sorts the tested IC devices and stores the tested IC devices comprises: test units for electrically connecting IC devices to an IC socket for transmitting electrical signals provided by the IC devices to an IC tester; a loader/unloader unit for transferring IC devices to be tested from a container to a carrier, sorting tested IC devices and selectively transferring the tested IC devices from the carrier to containers; and carrier transfer units combined with the test units, respectively, to transfer the carrier from the loader/unloader unit to the corresponding test units and from the corresponding test units to the loader/unloader unit.

The number of the test units to be used in combination with the loader/unloader unit is varied according to test time required by the IC tester for testing the IC devices contained in the carrier.

According to the present invention, the loader/unloader unit and the test units are mounted on separate frames, respectively, and each carrier transfer unit for transferring the carrier from the loader/unloader unit to the test unit and from the test unit to the loader/unloader unit is combined with the test unit. Accordingly, the number of test units to be used in combination with the loader/unloader unit can be varied according to test time required by the IC tester for testing IC devices. When a long test time is necessary for the IC tester to test IC devices, a plurality of test units can be connected to the loader/unloader unit. Therefore, the handling system requires a small investment in constructing the same and is capable of being readily rearranged for measuring IC devices requiring a short test time.

BRIEF DESCRIPTION OF THE DRAWINGS

The above and other objects, features and advantages of the invention will become more apparent from the following description taken in connection with the accompanying drawings, in which:

FIG. 5 is a timing chart of assistance in explaining the operation of the autohandler of the handling system of FIG. 4.

DETAILED DESCRIPTION OF THE PREFERRED EMBODIMENTS

Figure 1:
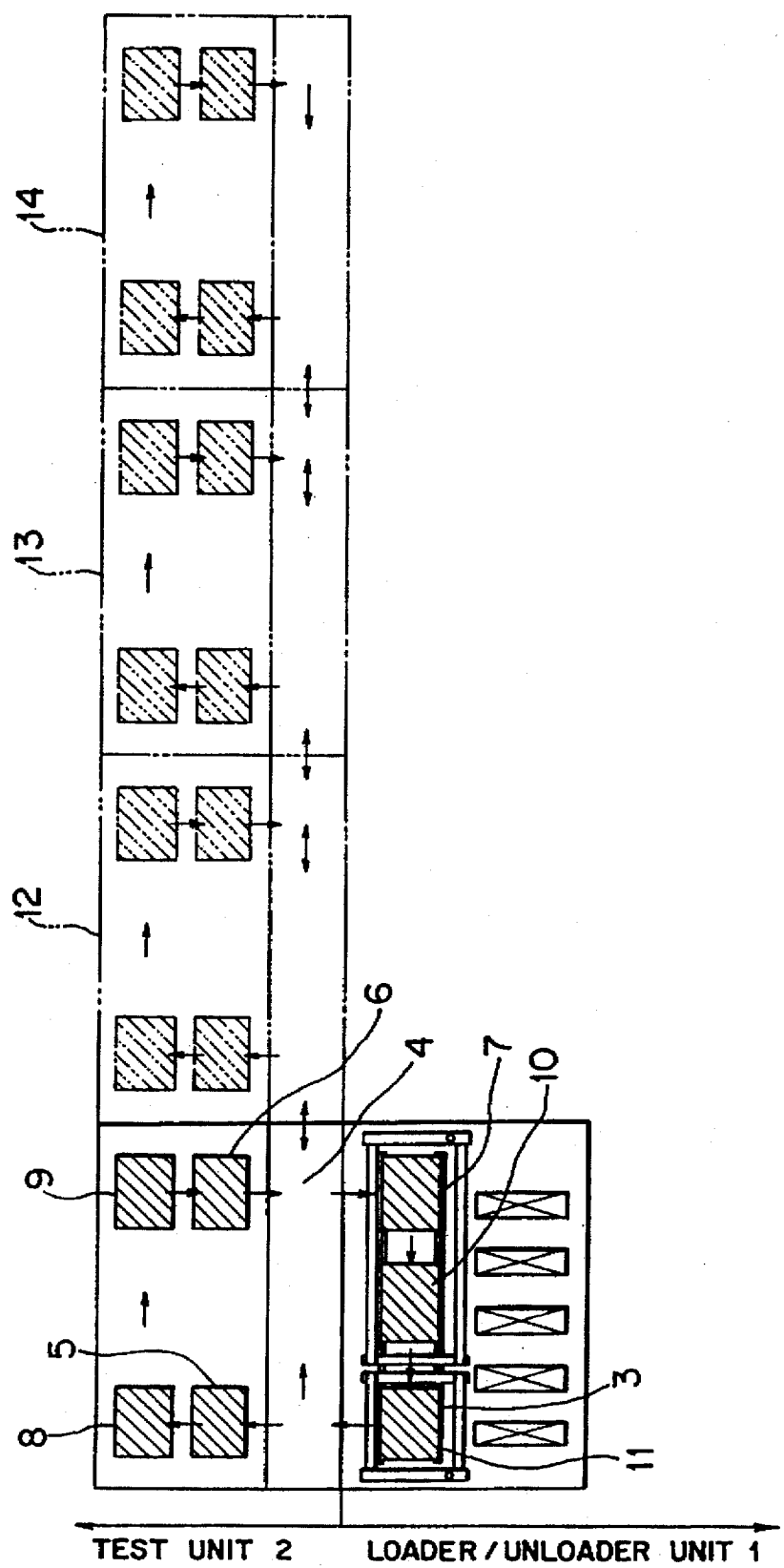
FIG. 1 is a diagrammatic view of a handling system in a first embodiment according to the present invention.
Figure 4:
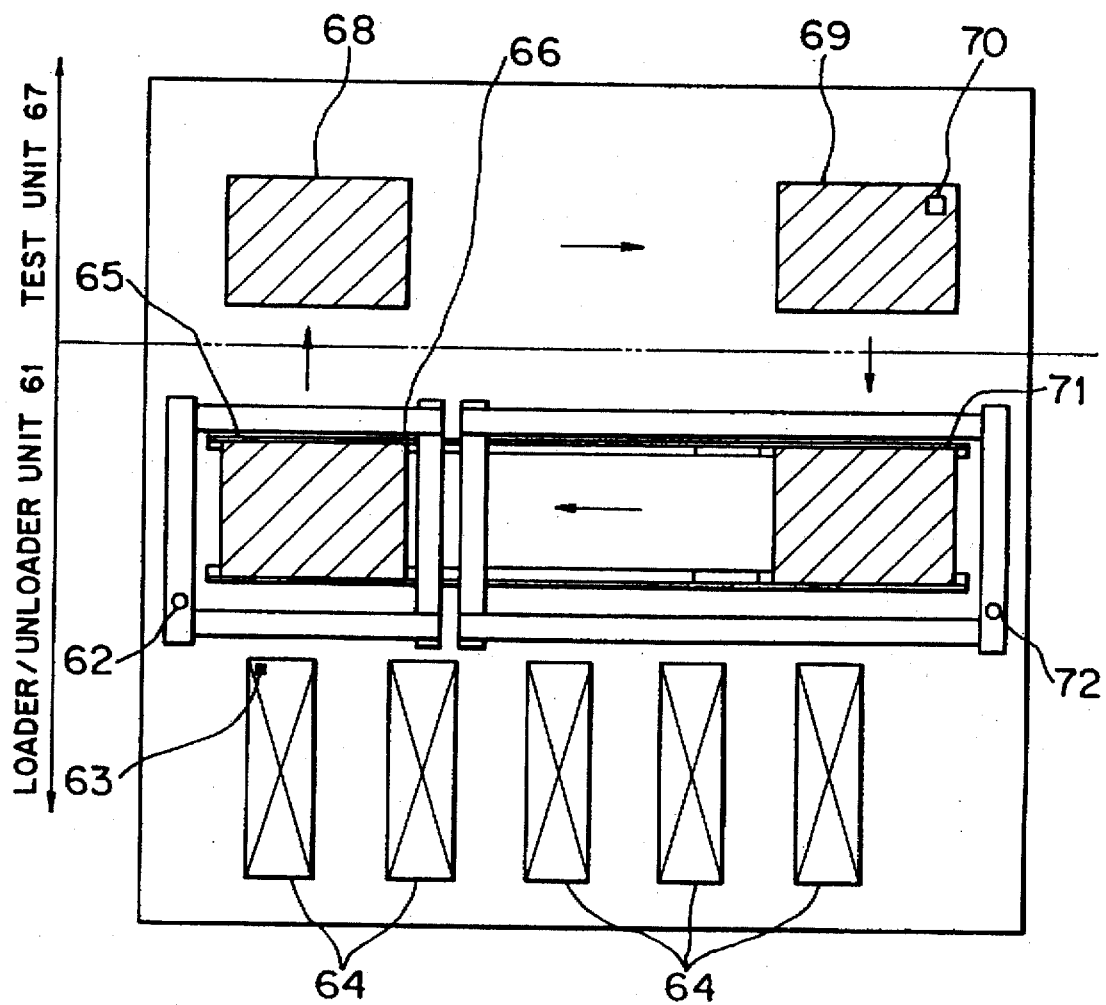
FIG. 4 is a diagrammatic view of a transfer system of an autohandler included in a conventional handling system.

Referring to FIG. 1, a handling system in a first embodiment according to the present invention comprises a loader/unloader unit 1, test units 2, 12, 13 and 14, and carrier transfer units 4 combined with the test units 2, 12, 13 and 14, respectively. The loader/unloader 1 and the test units 2, 12, 13 and 14 are mounted on separate frames, respectively. Each of the test units 2, 12, 13 and 14 is combined with the carrier transfer unit 4 for transferring a carrier 3 between the loader/unloader 1 and the test units 2, 12, 13 and 14. The handling system shown in FIG. 1, carries IC devices by the same method as that by which the foregoing known handling system shown in FIG. 4 carries IC devices. Each of the test units 2, 12, 13 and 14 is provided with a feed buffer station 5 and a return buffer station 6 for temporarily storing a carrier 3, and the loader/unloader unit 1 is provided with a return buffer station 7 for temporarily storing a carrier 3 to enable the handling system to operate at a high efficiency. Since the test units 2, 12, 13 and 14 are combined with the carrier transfer units 4, respectively, the loader-unloader unit 1 is able to distribute carriers 3 to the test units 2, 12, 13 and 14.

Figure 2:
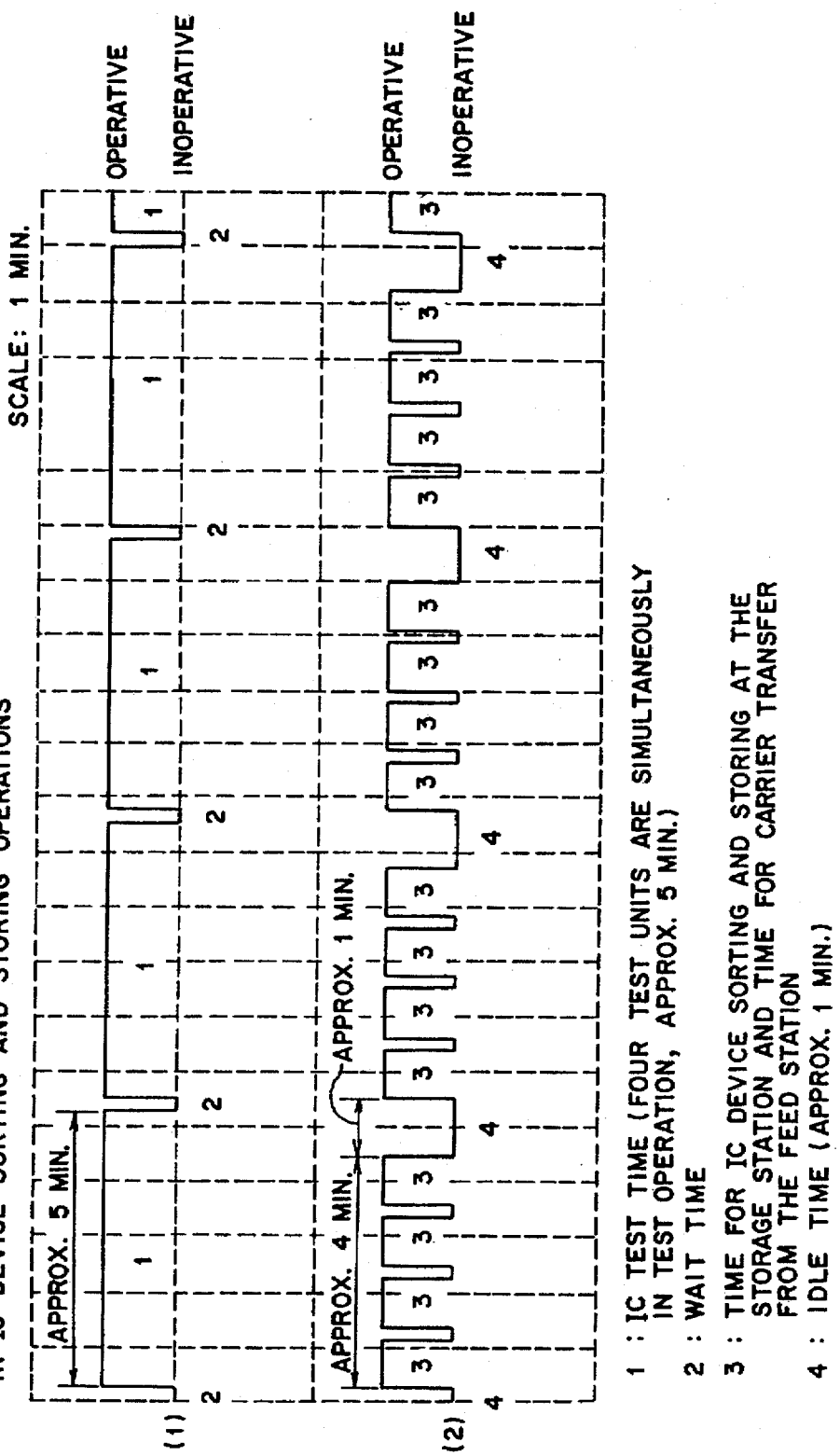
FIG. 2 is a timing chart of assistance in explaining the operation of the handling system of FIG. 1.

FIG. 2 is a timing chart showing the operation of the handling system comprising the loader/unloader unit 1 and the four test units 2, 12, 13 and 14, when time necessary for the test units 2, 12, 13 and 14 to test IC devices on one carrier is about 5 rain and time necessary for the loader/unloader unit 1 to sort and store tested IC devices and to load a carrier with IC devices and transfer the carrier carrying the IC device to each of the test units 2, 12, 13 and 14 is about 1 min. A carrier carrying IC devices is transferred through a preheating station 9 to a measuring station 9 on each test unit Time necessary for sorting IC devices and selectively transferring the IC devices from one carrier 3 to containers, such as magazines or trays, at a return station 10, and transferring IC devices from a container to a carrier 3 at a feed station 11 for testing on the test unit 2 is about 1 min. Since the test time is 5 min, the idle time of the loader/unloader unit 1 is 1 min. This idle time is shorter than the idle time of the transfer system of a conventional handling system, and hence the efficiency of the handling system is higher than that of the conventional handling system. Since the handling system needs only one loader/unloader unit, the handling system requires less investment than the conventional handling system which needs four loader/unloader units for four test units.

Figure 3:
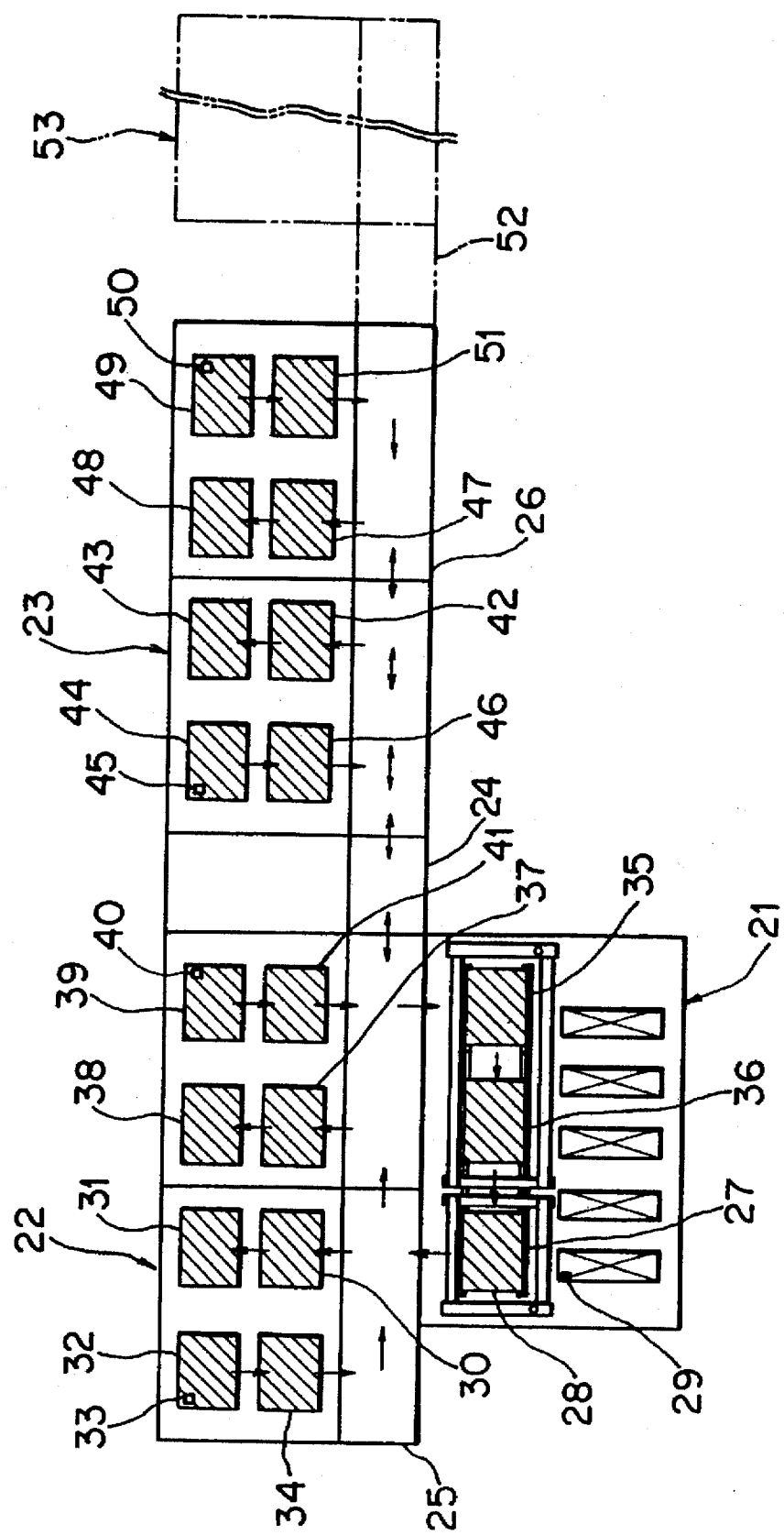
FIG. 3 is a diagrammatic view of a handling system in a second embodiment according to the present invention.

Referring to FIG. 3 showing a handling system in a second embodiment according to the present invention, The handling system comprises a loader/unloader unit 21, two test units 22 and 23 provided with transfer units 25 and 26, respectively, and an intermediate transfer unit 24 disposed between the two test units 22 and 23. The intermediate test unit 24 is employed to secure a space for maintenance work between the test units 22 and 23. The test unit 23 has two measuring stations and hence two IC testers can be connected to the test unit 23.

A carrier 27 carrying untested IC devices 29 is carried from a feed station 28 in the loader/unloader unit 21 through the transfer unit 25 and a preheating station 31 to a measuring station 32 in the test unit 22. The untested IC devices 29 are connected electrically to an IC socket 33, and then the IC tester tests the IC devices. After the test has been completed, the carrier 27 carrying tested IC devices is transferred through the transfer unit 25 to a storage station 36 in the loader/unloader 21. A carrier 27 carrying untested IC devices 29 is carried from the feed station 28 in the loader/unloader unit 21 through the transfer unit 25 and a preheating station 38 to a measuring station 39 in the test unit 22. The untested IC devices 29 are connected electrically to an IC socket 40, and then an IC tester tests the IC devices. After the test has been completed, the carrier 27 carrying tested IC devices is returned through the transfer unit 25 to the storage station 36 in the loader/unloader unit 21.

A carrier 27 carrying untested IC devices 29 is carried from the feed station 28 in the loader/unloader unit 21 through the transfer unit 25, the intermediate transfer unit 24 and the transfer unit 26 and a preheating station 43 to a measuring station 44 in the test unit 23. The untested IC devices 29 are connected electrically to an IC socket 45, and then an IC tester tests the IC devices. After the test has been completed, the carrier 27 carrying tested IC devices is returned through the transfer unit 26 the intermediate transfer unit 24 and the transfer unit 25 to the storage station 36 in the loader/unloader unit 21. A carrier 27 carrying untested IC devices is carried from the feed station 28 through the transfer unit 25, the intermediate transfer unit 24, the transfer unit 26 and a preheating station 48 to a measuring station 49 in the test unit 23. The untested IC devices are connected electrically to an IC socket 50 and then an IC tester tests the IC devices. After the test has been completed, the carrier 27 carrying the tested IC devices is returned through the transfer unit 26, the intermediate transfer unit 24 and the transfer unit 25 to the storage station 36 of the loader/unloader unit 21.

The test units 22 and 23 are provided with feed buffer stations 30, 37, 42 and 47 and a return buffer stations 34, 41, 46 and 51, respectively, to store the carriers 27 temporarily in order that the test units 22 and 23 are able to operate efficiently. The loader/unloader unit 21 is provided with a return buffer station 35 to store the carrier 27 temporarily in order that the loader/unloader unit is able to operate efficiently.

If the test time necessary for the IC tester to test the IC devices is longer, the handling system may be provided with an intermediate transfer unit 52 and a test unit 53 additionally nest to the test unit 23. If the test time necessary for the IC tester to test the IC devices is shorter, the intermediate transfer unit 24 and the test unit 23 may be kept inoperative or removed.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A handling system which carries a carrier carrying a plurality of IC devices, subjects the IC devices to testing, sorts the tested IC devices and stores the tested IC devices, said handling system comprising:

test units for electrically connecting IC devices to an IC socket for transmitting electrical signals provided by the IC devices to an IC tester;

a loader/unloader unit for transferring IC devices to be tested from a container to a carrier, sorting tested IC devices and selectively transferring the tested IC devices from the carrier to containers; and carrier transfer units combined with the test units, respectively, to transfer the carrier from the loader/unloader unit to the corresponding test units and from the corresponding test units to the loader/unloader unit;

wherein the number of the test units to be used in combination with the loader/unloader unit being varied according to test time required by the IC tester for testing the IC devices contained in the carrier.

\* \* \* \* \*